United States Patent
Chung

(10) Patent No.: US 8,598,927 B2
(45) Date of Patent: Dec. 3, 2013

(54) INTERNAL CLOCK GENERATOR AND OPERATING METHOD THEREOF

(75) Inventor: Jin-Il Chung, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 64 days.

(21) Appl. No.: 13/329,772

(22) Filed: Dec. 19, 2011

(65) Prior Publication Data

US 2012/0249199 A1    Oct. 4, 2012

(30) Foreign Application Priority Data

Mar. 31, 2011    (KR) .................. 10-2011-0029354

(51) Int. Cl.
*H03L 7/06*    (2006.01)
(52) U.S. Cl.
USPC ........................................ 327/158; 327/149
(58) Field of Classification Search
USPC .................................. 327/149, 158
See application file for complete search history.

(56) References Cited

U.S. PATENT DOCUMENTS

| 2011/0221495 | A1* | 9/2011 | Lee et al. | 327/158 |
| 2012/0081161 | A1* | 4/2012 | Shin | 327/158 |
| 2012/0154001 | A1* | 6/2012 | Seo | 327/158 |
| 2012/0194241 | A1* | 8/2012 | Shin | 327/158 |
| 2012/0249199 | A1* | 10/2012 | Chung | 327/158 |
| 2012/0268181 | A1* | 10/2012 | Fujimaki | 327/158 |
| 2013/0162312 | A1* | 6/2013 | Jung et al. | 327/158 |

FOREIGN PATENT DOCUMENTS

KR    100859834    9/2008

OTHER PUBLICATIONS

Notice of Preliminary Rejection issued by the Korean Intellectual Property Office on Mar. 19, 2013.

* cited by examiner

*Primary Examiner* — Adam Houston
(74) *Attorney, Agent, or Firm* — IP & T Group LLP

(57) ABSTRACT

An internal clock signal generation circuit includes a variable delay line unit including an initial variable delayer having an initial delay amount controlled based on condition information and configured to delay an input clock signal by a time corresponding to a delay control signal to output a delay locked loop (DLL) clock signal, a delay replica modeling unit configured to delay the DLL clock signal by a time obtained by modeling a clock delay component and output a feedback clock signal, and a phase comparison unit configured to compare a phase of the input clock signal with a phase of the feedback clock signal and generate the delay control signal.

13 Claims, 3 Drawing Sheets

INTERNAL CLOCK GENERATOR AND OPERATING METHOD THEREOF

CROSS-REFERENCE TO RELATED APPLICATIONS

The present application claims priority of Korean Patent Application No. 10-2011-0029354, filed on Mar. 31, 2011, which is incorporated herein by reference in its entirety.

BACKGROUND

1. Field

Exemplary embodiments of the present invention relate to a semiconductor designing technology, and more particularly, to an internal clock signal generation circuit for receiving an external clock signal and generating an internal dock signal.

2. Description of the Related Art

Generally, a semiconductor device receives an external clock signal and generates an internal clock signal. The internal clock signal is used as a reference for synchronizing the inside operation timings of the semiconductor device. Therefore, a semiconductor device is typically equipped with an internal clock signal generation circuit for generating an internal clock signal, and representative examples of the internal clock signal generation circuit include a Delay Locked Loop (DLL) circuit and a Phase Locked Loop (PLL) circuit.

FIG. 1 is a block diagram illustrating a delay locked loop circuit, which is a typical internal clock signal generation circuit.

Referring to FIG. 1, the delay locked loop circuit includes an input buffering unit 110, a variable delay line unit 120, an output buffering unit 130, a delay replica modeling unit 140, and a phase comparison unit 150.

The input buffering unit 110 buffers an input clock signal CLK_IN, which is an external clock signal, and outputs a buffering clock signal CLK_BF. The variable delay line unit 120 delays the buffering clock signal CLK_BF by a time corresponding to a delay control signal CTR_DL and outputs a DLL clock signal CLK_DLL. The output buffering unit 130 buffers the DLL clock signal CLK_DLL and outputs an output clock signal CLK_OUT. Herein, the output clock signal CLK_OUT is a clock signal that is used to finally output a data.

Subsequently, the delay replica modeling unit 140 delays the DLL clock signal CLK_DLL by a time obtained by modeling internal clock delay components of the semiconductor device and outputs a feedback clock signal CLK_FDB. The phase comparison unit 150 compares the phase of the buffering clock signal CLK_BF with the phase of the feedback clock signal CLK_FDB and generates the delay control signal CTR_DL. The delay control signal CTR_DL generated in the phase comparison unit 150 is inputted to the variable delay line unit 120, and the delay time of the buffering clock signal CLK_BF is controlled in response to the delay control signal CTR_DL.

FIG. 2 is a timing diagram illustrating an operation timing of the delay locked loop circuit shown in FIG. 1. The drawing shows the input clock signal CLK_IN, the buffering clock signal CLK_BF, the DLL clock signal CLK_DLL, and the output clock signal CLK_OUT.

Referring to FIGS. 1 and 2, the input buffering unit 110 receives and buffers the input clock signal CLK_IN and outputs a buffering clock signal CLK_BF. Here, the buffering clock signal CLK_BF is a signal obtained by adding a delay time of tD1 to the input clock signal CLK_IN. The buffering clock signal CLK_BF is delayed by a time of 'tD3' in the variable delay line unit 120 to become the DLL clock signal CLK_DLL. The output buffering unit 130 receives and buffers the DLL clock signal CLK_DLL and outputs the output clock signal CLK_OUT. Here, the output clock signal CLK_OUT is a signal obtained by adding a delay time of 'tD2' to the DLL clock signal CLK_DLL, and the output clock signal CLK_OUT is used to output a data DTA.

The 103' shown in FIG. 2 is a delay time taken to delay the buffering clock signal CLK_BF in the variable delay line unit 120 and the 'tD3' is represented by the following Equation 1.

$$tD3 = N \ast tCK - (tD1 + tD2) \qquad \text{Equation 1}$$

where N is a natural number.

FIG. 2 shows an operation waveform when the locking operation of the delay locked loop circuit is completed. Although not illustrated in FIG. 2, the feedback clock signal CLK_FDB desirably has the same phase as the buffering clock signal CLK_BF when the locking operation is completed.

Meanwhile, the buffering clock signal CLK_BF and the feedback clock signal CLK_FDB are transferred to the phase comparison unit 150 through different delay line paths. To be specific, the buffering clock signal CLK_BF is transferred to the phase comparison unit 150 through a delay line path corresponding to the input buffering unit 110, and the feedback clock signal CLK_FDB is transferred to the phase comparison unit 150 through a delay line path corresponding to the input buffering unit 110, the variable delay line unit 120, and the delay replica modeling unit 140. Therefore, the feedback clock signal CLK_FDB is sensitive to a skew of process, voltage, and temperature (PVT) parameters more than the buffering clock signal CLK_BF.

Here, the signal that is transferred through a long delay line path is more sensitive to a PVT skew than the signal transferred through a short delay line path. For example, when the voltage level of the power supply voltage becomes low, the signal transferred through a long delay line path has a greater delay incremental amount than the signal transferred through a short delay line path.

Described hereafter is a case that the voltage level of the power supply voltage becomes low after a locking operation is completed while the voltage level of the power supply voltage applied to the delay locked loop circuit is high.

First, the completion of the locking operation means that the phase of the buffering clock signal CLK_BF and the phase of the feedback clock signal CLK_FDB become the same. Here, the delay line path of the buffering clock signal CLK_BF corresponds to the short delay line path, compared with the delay line path of the feedback clock signal CLK_FDB, and the delay line path of the feedback clock signal CLK_FDB corresponds to the long delay line path.

When the voltage level of the power supply voltage is decreased under the above circumstances, the delay amount of the feedback clock signal CLK_FDB is increased, compared with the delay amount when the locking operation is completed. The decrease in the delay amount of the feedback clock signal CLK_FDB is greater than that of the buffering clock signal CLK_BF. In short, the feedback clock signal CLK_FDB, which had the same phase as the buffering clock signal CLK_BF when the locking operation is completed, falls behind the buffering clock signal CLK_BF as the voltage level of the power supply voltage is decreased. Therefore, the delay locked loop circuit operates to decrease the delay amount in the variable delay line unit 120 to make the buffering clock signal CLK_BF and the feedback clock signal CLK_FDB have the same phase. However, when the variable delay line unit 120 does not decrease the delay amount any more, the delay locked loop circuit may operate improperly.

SUMMARY

Exemplary embodiments of the present invention are directed to a delay locked loop circuit whose initial delay amount is controlled based on a skew of process, voltage and temperature parameters.

In accordance with an exemplary embodiment of the present invention, an internal clock signal generation circuit includes a variable delay line unit including an initial variable delayer having an initial delay amount controlled based on condition information and configured to delay an input clock signal by a time corresponding to a delay control signal to output a delay locked loop (DLL) clock signal, a delay replica modeling unit configured to delay the DLL clock signal by a time obtained by modeling a clock delay component and output a feedback clock signal, and a phase comparison unit configured to compare a phase of the input clock signal with a phase of the feedback clock signal and generate the delay control signal.

The initial variable delayer may decide an initial delay amount based on the skew information before a locking operation is performed.

In accordance with another exemplary embodiment of the present invention, a method for operating an internal clock signal generation circuit includes setting a default delay amount as an initial delay amount when a voltage level of a power supply voltage is a low voltage level, setting an additional delay amount that is greater than the default delay amount as the initial delay amount when the voltage level of the power supply voltage is a high voltage level, and performing a locking operation based on the initial delay amount.

In accordance with further exemplary embodiment of the present invention, a semiconductor device includes a variable delay line unit having an initial delay amount controlled based on condition information of the semiconductor device and configure to delay an input clock signal by a time corresponding to a delay control signal to output a delay locked loop (DLL) clock signal, a delay replica modeling unit configured to delay the DLL clock signal by a time obtained by modeling a clock delay component of the semiconductor device to output a feedback clock signal, and a phase comparison unit configured to compare a phase of the input clock signal with a phase of the feedback clock signal and generate the delay control signal.

A delay locked loop circuit in accordance with an exemplary embodiment of the present invention may be protected from malfunctioning by controlling the initial delay amount of the delay locked loop circuit based on a skew of process, voltage and temperature parameters that is caused due to different delay line paths.

DETAILED DESCRIPTION

Figure 1:
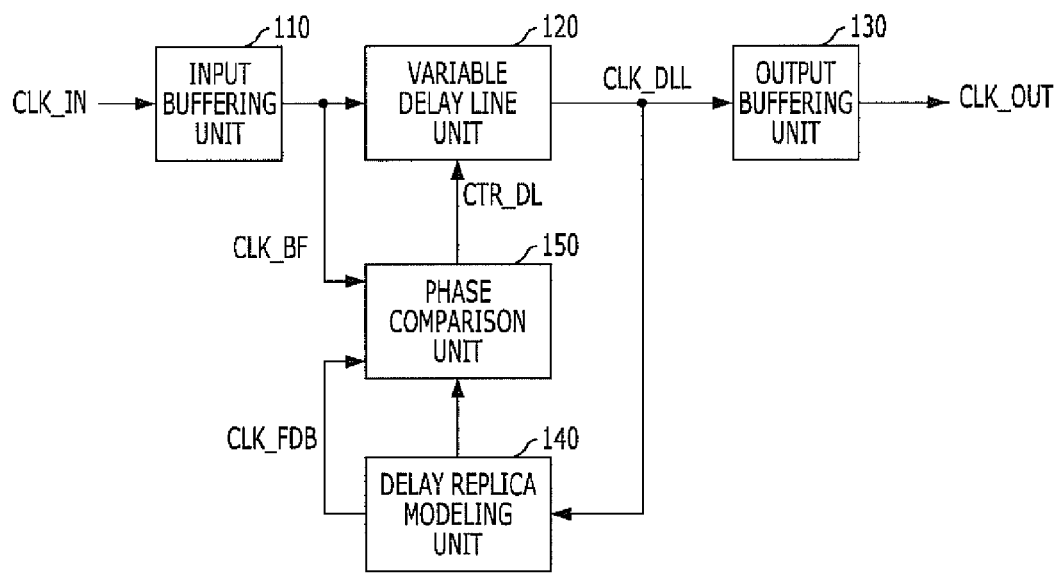
FIG. 1 is a block diagram illustrating a delay locked loop circuit, which is a typical internal clock signal generation circuit.
Figure 2:
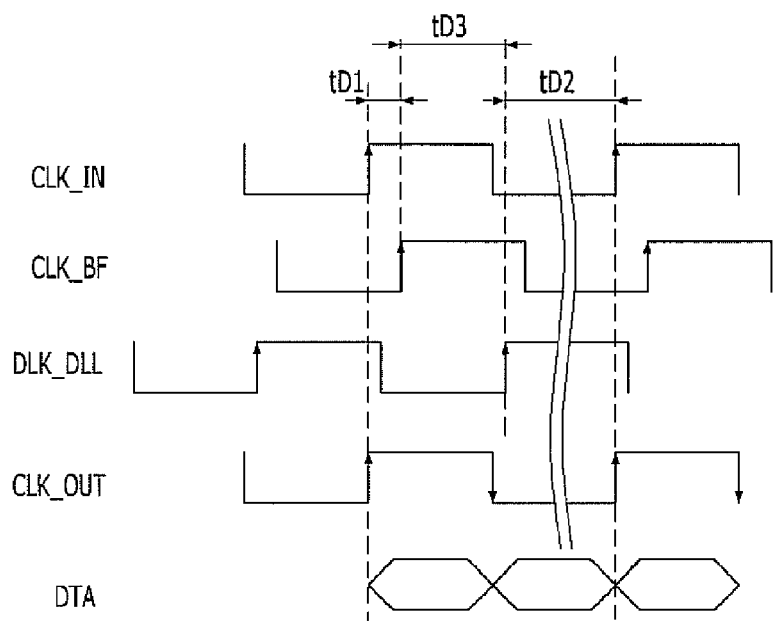
FIG. 2 is a timing diagram illustrating an operation timing of the delay locked loop circuit shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 3:
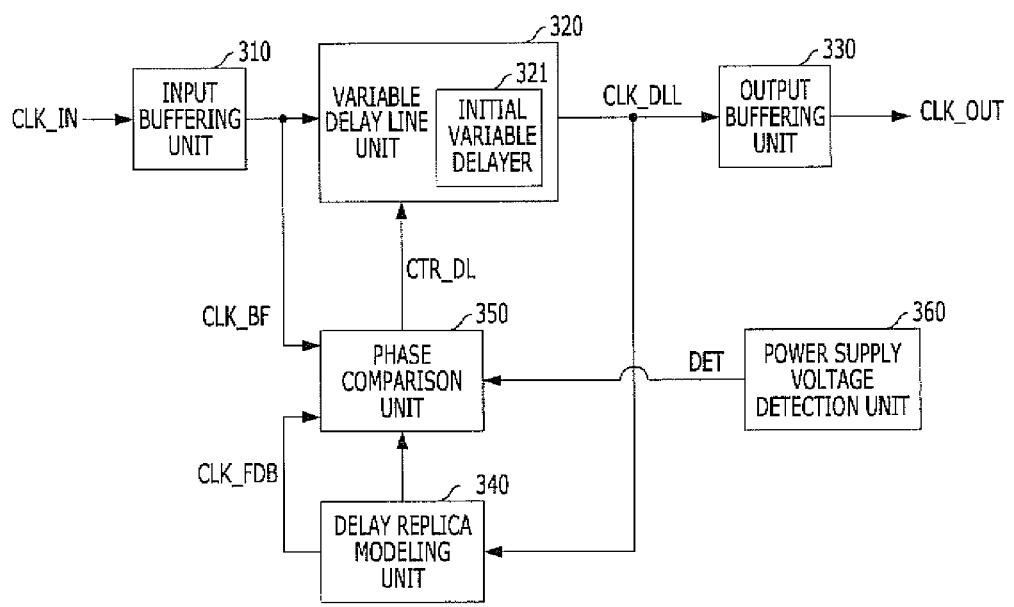
FIG. 3 is a block view illustrating a delay locked loop circuit, which is an internal clock signal generation circuit, in accordance with an exemplary embodiment of the present invention.

FIG. 3 is a block view illustrating a delay locked loop circuit, which is an internal clock signal generation circuit, in accordance with an embodiment of the present invention.

Referring to FIG. 3, the delay locked loop circuit includes an input buffering unit 310, a variable delay line unit 320, an output buffering unit 330, a delay replica modeling unit 340, a phase comparison unit 350, and a power supply voltage detection unit 360.

The input buffering unit 310 buffers an input clock signal CLK_IN, which is an external clock signal, and outputs a buffering clock signal CLK_BF. The variable delay line unit 320 delays the buffering clock signal CLK_BF by a time corresponding to a delay control signal CTR_DL and outputs a delay locked loop (DLL) clock signal CLK_DLL. Here, the variable delay line unit 320 is equipped with an initial variable delayer 321 in accordance with the embodiment of the present invention. The initial variable delayer 321 may control the initial delay amount in response to condition information that may be applied to a semiconductor device, e.g., a skew of process, voltage and temperature parameters.

The output buffering unit 330 buffers the DLL clock signal CLK_DLL and outputs an output clock signal CLK_OUT. The delay replica modeling unit 340 delays the DLL clock signal CLK_DLL by a time obtained by modeling a clock delay component and outputs a feedback clock signal CLK_FDB.

Subsequently, the phase comparison unit 350 generates the delay control signal CTR_DL by comparing the phase of the buffering clock signal CLK_BF with the phase of the feedback clock signal CLK_FDB. Also, the phase comparison unit 350 in accordance with the embodiment of the present invention may generate the delay control signal CTR_DL for controlling the initial delay amount of the initial variable delayer 321 in response to a detection signal DET, which is skew information. Lastly, the power supply voltage detection unit 360 generates the detection signal DET by detecting the voltage level of the power supply voltage.

The embodiment of the present invention presents an example of a delay locked loop circuit where the initial delay amount of the initial variable delayer 321 is controlled based on the voltage level of the power supply voltage. Hereafter, a simple circuit operation of the delay locked loop circuit shown in FIG. 3 is described.

First, the power supply voltage detection unit 360 generates the detection signal DET by detecting whether the voltage level of the power supply voltage is relatively high or relatively low. The phase comparison unit 350 then generates the delay control signal CTR_DL for controlling the initial delay amount of the initial variable delayer 321 in response to the detection signal DET. Subsequently, the initial variable delayer 321 sets a default delay amount as the initial delay amount in response to the delay control signal CTR_DL when the voltage level of the power supply voltage is low. When the voltage level of the power supply voltage is high, the initial variable delayer 321 sets an additional delay amount that is higher than the default delay amount as the initial delay amount. Subsequently, the delay locked loop circuit performs a locking operation based on the initial delay amount that is set in the initial variable delayer 321.

Figure 4:
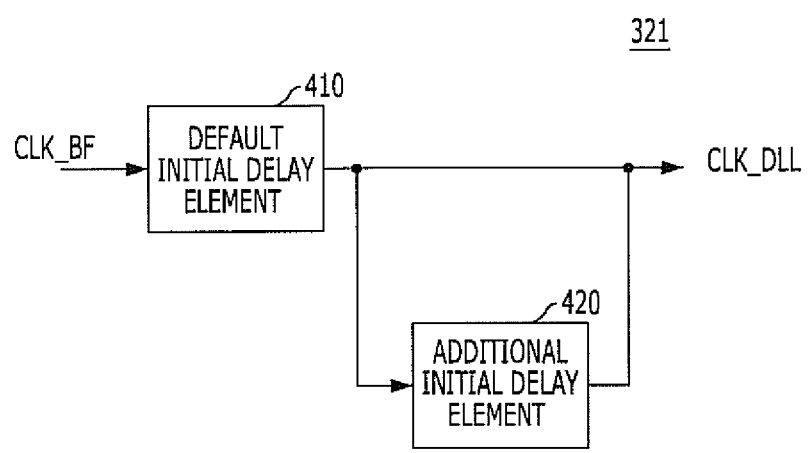
FIG. 4 is a block view illustrating an initial variable delayer shown in FIG. 3.

FIG. 4 is a block view illustrating the initial variable delayer 321 shown in FIG. 3.

Referring to FIGS. 3 and 4, the initial variable delayer 321 is provided with a default initial delay element 410 and an additional initial delay element 420.

The default initial delay element 410 delays the buffering clock signal CLK_BF by a time corresponding to the delay control signal CTR_DL disclosed in FIG. 3 and outputs the DLL clock signal CLK_DLL. The additional initial delay element 420 delays an output signal of the default initial delay element 410 by a time corresponding to the delay control signal CTR_DL and outputs the DLL clock signal CLK_DLL.

First, the initial variable delayer 321 shown in FIG. 4 may operate before the delay locked loop circuit performs a locking operation. The buffering clock signal CLK_BF is inputted to the initial variable delayer 321 before a locking operation.

In the initial variable delayer 321 in accordance with the embodiment of the present invention, whether to enable the additional initial delay element 420 or not is decided based on the voltage level of the power supply voltage. In other words, when the voltage level of the power supply voltage is a low voltage level before a locking operation, the additional initial delay element 420 is disabled and the buffering clock signal CLK_BF is delayed by a delay time applied by the default initial delay element 410, which is referred to as a default delay time, hereafter. When the voltage level of the power supply voltage is high before a locking operation, the additional initial delay element 420 is enabled and the buffering clock signal CLK_BF is delayed by a delay time applied by the default initial delay element 410 and the additional initial delay element 420, which is referred to as an additional delay time, hereafter.

After all, in the initial variable delayer 321, the default delay amount applied by the default initial delay element 410 is set as the initial delay amount when the voltage level of the power supple voltage is a low voltage level. When the voltage level of the power supply voltage is a high voltage level, the additional delay amount applied by the default initial delay element 410 and the additional initial delay element 420 is set as the initial delay amount.

Subsequently, when the voltage level of the power supply voltage is low before a locking operation, the buffering clock signal CLK_BF passes through the default initial delay element 410 and is outputted as the DLL clock signal CLK_DLL. In short, the buffering clock signal CLK_BF is not loaded by the additional initial delay element 420. Therefore, when the voltage level of the power supply voltage is low, the increase in jitter of an output signal may be prevented from being caused by the additional initial delay element 420 may be prevented.

As described above, the delay locked loop circuit in accordance with an embodiment of the present invention sets an additional delay amount that is greater than a default delay amount as the initial delay amount, when the voltage level of the power supply voltage is high before a locking operation is performed. Therefore, although the voltage level of the power supply voltage becomes low after a locking operation and the phase of the feedback clock signal CLK_FDB falls behind the phase of the buffering clock signal CLK_BF, the variable delay line unit 320 may decrease the delay amount of the feedback clock signal CLK_FDB as much as the additional delay amount that is increased from the default delay amount. Therefore, the delay locked loop circuit may perform a locking operation for making the phase of the buffering clock signal CLK_BF and the phase of the feedback clock signal CLK_FDB be the same.

According to an exemplary embodiment of the present invention, the operation properties of a delay locked loop circuit may be optimized by controlling the initial delay amount of the delay locked loop circuit based on a skew of process, voltage and temperature parameters and thus protecting the delay locked loop circuit from malfunctioning.

While the present invention has been described with respect to the specific embodiments, it will be apparent to those skilled in the art that various changes and modifications may be made without departing from the spirit and scope of the invention as defined in the following claims.

What is claimed is:

1. An internal clock signal generation circuit, comprising:
   a variable delay line unit including an initial variable delayer having an initial delay amount controlled based on condition information and configured to delay an input clock signal by a time corresponding to a delay control signal to output a delay locked loop (DLL) clock signal;
   a delay replica modeling unit configured to delay the DLL clock signal by a time obtained by modeling a clock delay component and output a feedback clock signal; and
   a phase comparison unit configured to compare a phase of the input clock signal with a phase of the feedback clock signal and generate the delay control signal,
   wherein the condition information includes skew information of process, voltage and temperatures parameters.

2. The internal clock signal generation circuit of claim 1, further comprising:
   a power supply voltage detection unit configured to detect a voltage level of a power supply voltage and generate the condition information corresponding to the detected voltage level of the power supply voltage.

3. The internal clock signal generation circuit of claim 1, wherein the initial variable delayer is configured to determine the initial delay amount based on the condition information before a locking operation is performed.

4. The internal clock signal generation circuit of claim 1, wherein the phase comparison unit is configured to generate the delay control signal for the variable delay unit to control the initial delay amount based on the condition information.

5. The internal clock signal generation circuit of claim 1, wherein the initial variable delayer comprises:
   a default initial delay element configured to add a default delay amount in transferring the input clock signal and output the DLL clock signal; and
   an additional initial delay element configured to add an additional delay amount that is greater than the default delay amount in transferring the input clock signal and output the DLL clock signal.

6. The internal clock signal generation circuit of claim 1, wherein the initial variable delayer comprises:
   a default initial delay element configured to delay the input clock signal using a delay amount corresponding to the delay control signal; and an additional initial delay element configured to delay an output signal of the default initial delay element using the delay amount corresponding to the delay control signal.

7. The internal clock signal generation circuit of claim 6, wherein whether to activate the additional initial delay element or not is determined based on the condition information.

8. A method for operating an internal clock signal generation circuit, comprising:
   setting a default delay amount as an initial delay amount when a voltage level of a power supply voltage is a low voltage level;
   setting an additional delay amount that is greater than the default delay amount as the initial delay amount when the voltage level of the power supply voltage is a high voltage level; and
   performing a locking operation based on the initial delay amount,
   wherein the initial delay amount is controlled based on skew information of process, voltage and temperatures parameters.

9. The method of claim 8, further comprising:
   generating a detection signal by detecting the voltage level of the power supply voltage.

10. The method of claim 9, wherein the default delay amount or the additional delay amount is set as the initial delay amount in response to the detection signal.

11. A semiconductor device, comprising:
   a variable delay line unit having an initial delay amount controlled based on condition information of the semiconductor device and configure to delay an input clock signal by a time corresponding to a delay control signal to output a delay locked loop (DLL) clock signal;
   a delay replica modeling unit configured to delay the DLL clock signal by a time obtained by modeling a clock delay component of the semiconductor device to output a feedback clock signal; and
   a phase comparison unit configured to compare a phase of the input clock signal with a phase of the feedback clock signal and generate the delay control signal,
   wherein the condition information includes skew information of process, voltage and temperatures parameters.

12. The semiconductor device of claim 11, further comprising:
   a power supply voltage detection unit configured to detect a voltage level of a power supply voltage and generate the condition information corresponding to the detected voltage level of the power supply voltage.

13. The semiconductor device of claim 12, wherein the phase comparison unit is configured to generate the delay control signal in response to the condition information and the variable delay line unit is configured to adjust the initial delay amount in response to the delay control signal.

* * * * *